United States Patent
Piret et al.

(10) Patent No.: US 7,398,456 B2
(45) Date of Patent: Jul. 8, 2008

(54) INFORMATION ENCODING BY SHORTENED REED-SOLOMON CODES

(75) Inventors: Philippe Piret, Cesson-Sevigne (FR); Philippe Le Bars, Thorigne-Fouillard (FR); Frederic Lehobey, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 206 days.

(21) Appl. No.: 10/565,280

(22) PCT Filed: Jul. 21, 2004

(86) PCT No.: PCT/IB2004/002623
§ 371 (c)(1),
(2), (4) Date: Jan. 20, 2006

(87) PCT Pub. No.: WO2005/008900
PCT Pub. Date: Jan. 27, 2005

(65) Prior Publication Data
US 2006/0227017 A1    Oct. 12, 2006

(30) Foreign Application Priority Data
Jul. 21, 2003    (FR)    ................................. 03 08868

(51) Int. Cl.
*H03M 13/00* (2006.01)
(52) U.S. Cl. ......................................... 714/781; 714/784
(58) Field of Classification Search ................. 712/228; 370/216; 714/758, 762, 786, 781, 784
See application file for complete search history.

(56) References Cited

U.S. PATENT DOCUMENTS

| 5,905,739 | A | | 5/1999 | Piret et al. | 371/37.01 |
|---|---|---|---|---|---|
| 5,951,677 | A | * | 9/1999 | Wolf et al. | 712/228 |
| 6,385,751 | B1 | * | 5/2002 | Wolf | 714/784 |
| 6,490,243 | B1 | * | 12/2002 | Tanaka et al. | 370/216 |
| 6,543,021 | B1 | | 4/2003 | Piret | 714/752 |
| 6,571,368 | B1 | * | 5/2003 | Chen | 714/784 |
| 6,578,170 | B1 | | 6/2003 | Piret et al. | 714/758 |
| 6,578,171 | B1 | | 6/2003 | Braneci et al. | 714/786 |

(Continued)

OTHER PUBLICATIONS

Lin, S. et al., "Error Control Coding", Fundamentals and Applications, Englewood Cliffs, Prentice Hall, US, pp. 85-124, 1983.

(Continued)

*Primary Examiner*—David Ton
(74) *Attorney, Agent, or Firm*—Fitzpatrick, Cella, Harper & Scinto (57) ABSTRACT

The present invention concerns an encoding method in which encoding is performed of any information word a of length k in the form of a word v belonging to a Reed-Solomon code C of dimension k' and length n' (with n'−k'=n−k) such that the components of v' situated in (n'−n) arbitrary predetermined positions be systematically equal to respective predetermined constants (for example, all zero). The possibility then exists of deleting those components of fixed value to obtain a word v of length n belonging to a code C, which thus constitutes a code that is shortened with respect to code C. The invention also relates to devices and apparatuses adapted to implement the encoding method. The invention may be used for encoding by means of an algebraic geometric code, when such encoding may be implemented by encoding by means of a plurality of shortened Reed-Solomon codes.

18 Claims, 2 Drawing Sheets

U.S. PATENT DOCUMENTS

| | | | | |
|---|---|---|---|---|
| 6,638,318 | B1 | 10/2003 | Piret et al. | 718/781 |
| 6,766,489 | B1 | 7/2004 | Piret et al. | 714/755 |
| 6,859,905 | B2 * | 2/2005 | Seki | 714/784 |
| 6,910,006 | B2 | 6/2005 | Piret | 704/203 |
| 6,993,698 | B2 | 1/2006 | Piret | 714/755 |
| 7,024,616 | B2 * | 4/2006 | Ohira et al. | 714/786 |
| 7,069,492 | B2 | 6/2006 | Piret | 714/762 |
| 7,082,564 | B2 * | 7/2006 | Fredrickson et al. | 714/784 |
| 7,256,717 | B2 | 8/2007 | Piret et al. | 341/58 |
| 2004/0117719 | A1 | 6/2004 | Lehobey et al. | 714/781 |
| 2004/0194006 | A1 | 9/2004 | Piret et al. | 714/800 |
| 2005/0015704 | A1 | 1/2005 | Piret et al. | 714/781 |
| 2005/0138533 | A1 | 6/2005 | Le Bars et al. | 714/784 |
| 2005/0188291 | A1 | 8/2005 | Piret et al. | 714/752 |
| 2005/0204268 | A1 | 9/2005 | Piret et al. | 714/781 |
| 2005/0210357 | A1 | 9/2005 | Piret et al. | 714/752 |
| 2005/0257115 | A1 | 11/2005 | Piret et al. | 714/752 |

OTHER PUBLICATIONS

Giu-Liang Feng, et al., "Reflections on the "Decoding of Algebraic-Geometric Codes up to the Designed Minimum Distance"", pp. 1-11, Mar. 15, 1995, URL=http://www.cs.mcgill.ca/{crepeau/PS/Feng-Rao.ps>.

Pellikaan, R., et al., "Which Linear Codes are Algebraic-Geometric?", IEEE Transactions on Information Theory, vol. 37, No. 3, pp. 583-602, May 1, 1991, New York.

Heegard, C., et al., "Systematic Encoding via Gröbner Bases for a Class of Algebraic-Geometric Goppa Codes", IEEE Transactions on Information Theory, vol. 41, No. 6, Nov. 1995, pp. 1752-1761, New York.

Matsumoto, R., et al., "Fast Encoding of Algebraic Geometry Codes", IEICE Transactions on Fundamentals of Electronics, Communications and Computer Sciences, Institute of Electronics Information and Comm. Eng., Tokyo, JP, vol. E84A, No. 10, pp. 2514-2517, Oct. 2001.

Blake, I., et al., "Algebraic-Geometry Codes", IEEE Transactions on Information Theory, IEEE Inc., New York, US, vol. 44, No. 6, pp. 2596-2618, Oct. 1998.

Feng, G-L et al., "Improved Geometric Goppa Codes, Part I: Basic Theory", IEEE Transactions on Information Theory, IEEE Inc., New York, US, vol. 41, No. 6, pp. 1678-1693, Nov. 1995.

Lint, Van J.H., "Algebraic Geometric Codes", Coding Theory and Design Theory, vol. 21, pp. 137-162, 1990.

\* cited by examiner

INFORMATION ENCODING BY SHORTENED REED-SOLOMON CODES

This application is a National Stage Filing Under 35 U.S.C. §371 of International Application No. PCT/IB2004/002623, filed Jul. 21, 2004, and published in English as International Publication No. WO 2005/008900, Jan. 27, 2005.

The present invention concerns communication systems in which the data to be transmitted are subjected to a channel encoding in order to improve the fidelity of the transmission. It concerns more particularly decoding methods as well as the devices and apparatuses adapted to implement those methods.

It will be recalled that so-called "channel" encoding consists, when the "codewords" sent to the receiver are formed, of introducing a certain amount of redundancy in the data to be transmitted. More particularly, by means of each codeword, the information is transmitted that is initially contained in a predetermined number k of symbols taken from an "alphabet" of finite size q; on the basis of these k information symbols, calculation is made of a number n>k of symbols belonging to that alphabet, which constitute the components of the codewords: $v \equiv (v_0, v_1, \ldots, v_{n-1})$ (the symbol "≡" means "by definition"). The set of codewords obtained when each information symbol takes some value in the alphabet constitutes a sort of dictionary referred to as a "code" of "dimension" k and "length" n.

In particular, certain codes, termed "linear codes" are such that any linear combination of codewords (with the coefficients taken from the alphabet) is still a codeword. These codes may conveniently be associated with a matrix H of dimension (n−k)×n, termed "parity matrix": a word v of given length n is a codeword if, and only if, it satisfies the relationship: $H \cdot v^T = 0$ (where the exponent T indicates the transposition); the code is then said to be "orthogonal" to the matrix H.

Among these linear codes, certain have the property of being "cyclic": for any given codeword $(v_0, v_1, \ldots, v_{n-1})$, the word $(v_{n-1}, v_0, v_1, \ldots, v_{n-2})$ obtained by cyclic permutation is a word of the same code. The words belonging to a cyclic linear code may conveniently be represented by means of polynomials: if the polynomial $$v(x) \equiv \sum_{i=0}^{n-1} v_i x^i$$

is made to correspond to some word $v = (v_0, v_1, \ldots, v_{n-1})$, a given word v belongs to a given cyclic linear code if, and only if, the corresponding polynomial v(x) is a multiple of a certain polynomial g(x), of degree (n−k) and divisor of $(x^n - 1)$, termed "generator polynomial" of the cyclic linear code which characterizes it. Moreover a parity matrix H can be associated with any generator polynomial g(x).

At the receiver, the decoding method correlative to a given encoding method judiciously exploits the redundancy incorporated in the codewords to detect any transmission errors and if possible to correct them. There is a transmission error if the difference e between a received word r and the corresponding codeword v sent by the transmitter is non-zero.

More particularly, the decoding is carried out in two main steps.

The first step consists of associating an "associated codeword" with the received word. Conventionally, the decoder first of all calculates the vector of "error syndromes" $H \cdot r^T = H \cdot e^T$. If the syndromes are all zero, it is assumed that no transmission error has occurred, and the "associated code word" will then simply be taken to be equal to the received word. If that is not the case, it is thereby deduced that certain symbols in the received word are erroneous, and a correction algorithm is then implemented which is adapted to estimate the value of the error e; the algorithm will thus provide an estimated value ê such that (r−ê) is a codeword, which will then constitute the "associated codeword".

The second step simply consists in reversing the encoding method. In the ideal situation in which all the transmission errors have been corrected, the initial information symbols are thereby recovered.

The purpose of an error correction algorithm is to associate with the received word the codeword situated at the shortest Hamming distance from that received word, the "Hamming distance" being, by definition, the number of places where two words of the same length have a different symbol. The shortest Hamming distance between two different codewords of a code is termed the "minimum distance" d of that code. This is an important parameter of the code. More particularly, it is in principle possible to find the position of the possible errors in a received word, and to provide the correct replacement symbol (i.e. that is identical to that sent by the transmitter) for each of those positions, each time the number of erroneous positions is at most equal to INT[(d−1)/2] (where "INT" designates the integer part) for a code of minimum distance d (for certain error configurations, it is sometimes even possible to achieve better). However, in all cases, the concern is not with a possibility in principle, since it is often difficult to develop a decoding algorithm achieving such performance.

The present invention concerns in particular "Reed-Solomon" codes, which are reputed for their efficiency. These are cyclic linear codes, of which the minimum distance d is equal to (n−k+1). In general terms, codes of dimension k and of length n having a minimum distance d=n−k+1 are termed "MDS" (for "Maximum Distance Separable") since they are codes of which the minimum Distance allows a Maximum Separation between the codewords, account taken of the parameters k and n).

When the size q of the "alphabet" is a power of a prime number, the alphabet can be given the structure of what is known as a "Galois field" denoted $F_q$, of which the non-zero elements may conveniently be identified as each being equal to $\gamma^{i-1}$ for a corresponding value of i, where $i=1, \ldots, q-1$, and where γ is a primitive $(q-1)^{th}$ root of unity in $F_q$.

The parity matrix H of the Reed-Solomon code of dimension k and of length n (where n is necessarily equal to (q−1) or a divisor of (q−1)) is a matrix with m≡n−k lines and n columns, which may be defined for example by taking $H_{ij} = \alpha^{(i+1)j}$ ($0 \leq i \leq m-1$, $0 \leq j \leq n-1$), where α is an $n^{th}$ root of unity in $F_q$. The generator polynomial of this code is $$g(x) = \prod_{i=1}^{m}(x - \alpha^i).$$

Among the algorithms known for encoding a sequence $a = (a_0, a_1, \ldots, a_{k-1})$ of information symbols belonging to $F_q$ by means of a Reed-Solomon code, certain use that parity matrix H. In these algorithms, a certain relationship is chosen between the information symbols and those of the corresponding codeword v (for example $v_i = a_i$ for $0 \leq i \leq k-1$; in this case, the encoding is said to be "systematic"). Next the components of v remaining to be determined are calculated using the matrix equation $H \cdot v^T = 0$ it is thus necessary to solve (n−k)

linear equations on $F_q$, which constitutes a relatively complex calculation. Other encoding methods use the divisibility of the polynomial v(x) by the polynomial generator g(x); this is in particular the case of the so-called "Euclidean" algorithm, of which the operation will be described in detail below, and which requires calculations which are appreciably less complex than the algorithms just mentioned using the parity matrix H.

To decode Reed-Solomon codes, a so-called "Berlekamp-Massey" algorithm is usually employed for the detection of the erroneous positions in a received word, and a so-called "Forney" algorithm for the correction of the corresponding erroneous symbols. For more details on Reed-Solomon codes, reference may for example be made to the work by R. E. Blahut entitled "*Theory and practice of error-control codes*", Addison-Wesley, Reading, Mass., 1983).

Like all codes, Reed-Solomon codes may be "shortened". It is said that a code C of length n, is a "shortened" version of a code C' of length n', if it comprises solely the words v' of C of which, for a number R of predetermined positions, the components are all zero: as these positions are known to the receiver, their transmission can be obviated, such that the length of the shortened code is n=n'−R. When C' is an "MDS" code as defined above, this amounts to encoding information sequences of reduced length k=k'−R=k'−n'+n (where k' designates the dimension of the code C') by means of the shortened code C, while however keeping the same redundancy m=n'−k'=n−k.

It will be noted that shortened Reed-Solomon codes have recently increased in importance due to the fact that encoding by means of a new, very efficient, type of code, termed "algebraic geometric code" may, in certain cases, be conveniently reduced to encoding by means of a plurality of shortened Reed-Solomon codes (for an introduction to algebraic geometric codes, reference may for example be made to the article by J. H. van Lint entitled "*Algebraic Geometric Codes*" in "*Coding Theory and Design Theory*" 1st part, *IMA Volumes Math. Appl.*, volume 21, Springer-Verlag, Berlin, 1990). An encoding method of that type is disclosed in the application FR-0301546 in the name of CANON.

In will be noted in passing that when it is intended to delete certain components of the codewords, it matters little if the fixed values of those components be all zero; they may possibly each have some predetermined value.

Clearly, a shortened Reed-Solomon code is still a linear code, but it is no longer a cyclic code. In order to form, on the basis of a sequence of information, a codeword belonging to a shortened Reed-Solomon code, it is naturally possible to implement an algorithm utilizing the parity matrix H' of the code H'. it suffices to assign the value zero (or a predetermined respective constant) to said predetermined components of v' in the equations represented by $H' \cdot v'^T = 0$. However, as has been stated, that algorithm utilizing the parity matrix necessitates complex calculations.

It would thus be desirable to be able to perform that encoding using a less complex algorithm, for example the Euclidean algorithm. Unfortunately, that algorithm does not enable a predetermined value (even zero) to be imposed in a natural manner on certain predetermined components of the codeword to be calculated. Without entering into details, it will simply be noted here that certain manipulations of polynomials are known making it possible to adapt the Euclidean algorithm to meet that requirement, but solely in the case in which said predetermined positions of the word v' are consecutive. This is however insufficient for example in the case of applications to the geometric algebraic codes concerned in the application FR-0301546 mentioned above, in which the components deleted by virtue of the shortening of a Reed-Solomon code are not necessarily consecutive.

According to another point of view, it is known to "puncture" the codewords at transmission: puncturing consists of dispensing with the transmission of certain predetermined components, whatever the value (not predetermined in this case) of those components. The drawback of puncturing with respect to shortening is that the components deleted by puncturing include a portion of the redundancy provided by the channel encoding. An irrecoverable loss of that redundancy thus ensues.

Thus, according to a first aspect, the invention relates to a method of encoding over a Galois field $F_q$, where q is an integer greater than 2 and equal to a power of a prime number, in which a word $v' = (v'_0, v'_1, \ldots, v'_{n'-1})$ is calculated, where $n' \geq 3$, belonging to an "MDS" linear cyclic code C' of dimension (n'−m), where $1 \leq m \leq n'-2$, on the basis of a word $a = (a_0, a_1, \ldots, a_{n-m-1})$ of information symbols, where m<n<n'. A set $s = (s_0, s_1, \ldots, s_{n-1})$ of strictly increasing integers, with $s_0 \geq 0$ and $s_{n-1} \leq n'-1$, having been predetermined, said method comprises the following steps:

a) forming the polynomial $$a(x) \equiv \sum_{i=m}^{n-1} a_{i-m} x^{s_i},$$

b) calculating the remainder r(x) of the Euclidean division of a(x) by the polynomial $$g(x) \equiv \sum_{p=0}^{m} g_p x^p$$

generating said code C', c) calculating the polynomial $$v^*(x) = a(x) - r(x) \equiv \sum_{i=0}^{n'-1} v^*_i x^i,$$

corresponding to the word $v^* = (v^*_0, v^*_1, \ldots, v^*_{n'-1})$, and d) taking $v' = v^*$ if $s_{m-1} = m-1$; otherwise obtaining said word v' by taking:

$$\underline{v'} = \underline{v^*} + \sum_{j=0}^{s_m-m-1} f_j \underline{\Gamma^j}, \quad (1)$$

in which the words $\Gamma^j$ of length n' are defined by: $\Gamma^j_{i=gi-j}$ for $j \leq i \leq j+m$, and $\Gamma^j_i = 0$ otherwise, and in which the elements $f_j$ of $F_q$ are calculated by means of the equations (1) in which, for the $(s_m - m)$ values of $i < s_m$ not belonging to the set s, each component $v'_i$ is taken equal to a respective predetermined constant.

Thus, according to the invention, encoding is performed of any information word a of length k in the form of a word v' belonging to a Reed-Solomon code C' of dimension k' and length n' (with n'−k'=n−k) such that the components of v' situated in (n'−n) arbitrary predetermined positions be systematically equal to respective predetermined constants (for example, all zero).

It will be noted that the method according to the invention is advantageously simple to implement. This is because on the one hand the method utilizes the Euclidean algorithm which is, as has been stated, of low complexity in comparison to an encoding on C' explicitly relying on a parity matrix H'. On the other hand, the method according to the invention comprises solving a system of linear equations having the coefficients $f_j$ as unknowns; however, as will be seen below on the basis of example embodiments, the dimension of that system of equations is generally only a few units.

Further to the steps succinctly stated above, it will naturally be possible to delete those components of fixed value to obtain a word v of length n belonging to a code C, which thus constitutes a code that is shortened with respect to code C'. By virtue of the invention, as the components of predetermined positions take, after encoding in C', a value fixed in advance, their deletion to form words of the shortened code C will not lead to any loss in redundancy.

For certain applications, it may be worthwhile to "modify" code C. A code $C^B$ is a "modified" version of a code C of length n if there is a square non-singular diagonal n×n matrix B such that each word $v^B$ of $C^B$ is equal to v·B with v in C. Therefore in the case in which it is desired to encode information symbols by means of words belonging to code $C^B$ rather than to code C, the following procedure will be followed:

Let $\beta_i$ denote the element of B in position (i,i). Said procedure then comprises:

constructing, on the basis of the information symbols, the polynomial $$a^B(x) \equiv \sum_{i=m}^{n-1} a_{i-m} \beta_{s_i}^{-1} x^{s_i},$$

implementing steps b), c) and d) of the method according to the invention, by replacing a(x) with $a^B(x)$, which gives a word $v'^B$, deleting the components of predetermined value from $v'^B$, which gives a word $v^B = (v^B_0, v^B_1, \ldots, v^B_{n-1})$, and calculating the word $v = (v_0, v_1, \ldots, v_{n-1})$ defined by: $v_i = v^B_i \beta_i$ for all i from 0 to (n−1).

According to particular features of the invention, n' is equal to (q−1) or is a divisor of (q−1), and $$g(x) = \prod_{i=1}^{m}(x - \alpha^i),$$

where α is an element of $F_q$ satisfying $\alpha^{n'}=1$. In this case, the code C' is thus a Reed-Solomon code, and C is a shortened Reed-Solomon code. This particular case of "MDS" linear cyclic code may in particular be useful for encoding by means of a complex code of which at least the encoding or the decoding may be reduced, in a certain manner, to the encoding or decoding of at least one shortened Reed-Solomon code. The present invention may thus, for example, be applied to the method disclosed in application FR-0301546, mentioned above, in which said complex code is an algebraic geometric code.

More generally, still according to the same first aspect, the invention relates to a method of encoding for algebraic geometric codes, comprising at least one step in which codewords belonging to a shortened "MDS" linear cyclic code are calculated, said method being remarkable in that said calculation is performed by means of any one of the encoding methods succinctly described above.

According to a second aspect, the invention relates to a device for encoding over a Galois field $F_q$, where q is an integer greater than 2 and equal to a power of a prime number, in which a word $v' = (v'_0, v'_1, \ldots, v'_{n'-1})$ is calculated, where $n' \geq 3$, belonging to an "MDS" linear cyclic code C' of dimension (n'−m), where $1 \leq m \leq n'-2$, on the basis of a word $a = (a_0, a_1, \ldots, a_{n-m-1})$ of information symbols, where m<n<n'. A set $s = (s_0, s_1, \ldots, s_{n-1})$ of strictly increasing integers, with $s_0 \geq 0$ and $s_{n-1} \leq n'-1$, having been predetermined, said device is adapted to:

a) form the polynomial $$a(x) \equiv \sum_{i=m}^{n-1} a_{i-m} x^{s_i},$$

b) calculate the remainder r(x) of the Euclidean division of a(x) by the polynomial $$g(x) \equiv \sum_{p=0}^{m} g_p x^p$$

generating said code C', c) calculate the polynomial $$v^*(x) = a(x) - r(x) \equiv \sum_{i=0}^{n'-1} v_i^* x^i,$$

corresponding to the word $v^* = (v^*_0, v^*_1, \ldots, v^*_{n'-1})$, and d) take $v' = v^*$ if $s_{m-1} = m-1$; otherwise to obtain said word v' by taking:

$$\underline{v}' = \underline{v}^* + \sum_{j=0}^{s_m - m - 1} f_j \underline{\Gamma}^j, \quad (1)$$

in which the words $\Gamma^j$ of length n' are defined by: $\Gamma^j_i = g_{i-j}$ for $j \leq i \leq j+m$, and $\Gamma^j_i = 0$ otherwise, and in which the elements $f_j$ of $F_q$ are calculated by means of the equations (1) in which, for the $(s_m - m)$ values of $i < s_m$ not belonging to the set s, each component $v'_i$ is taken equal to a respective predetermined constant.

According to particular features, n' is equal to (q−1) or is a divisor of $$(q-1), \text{ and } g(x) = \prod_{i=1}^{m}(x - \alpha^i),$$

where α is an element of $F_q$ satisfying $\alpha^{n'}=1$.

According to a third aspect, the invention also relates to various apparatuses.

Thus, firstly, the invention concerns an apparatus for processing data comprising a source of information symbols, said apparatus being remarkable in that it further comprises:
- a storage unit adapted to accumulate said symbols so as to form codewords a each containing a predetermined number k of symbols,
- an encoding device as described succinctly above, and
- a transmitter adapted to transmit the words v' resulting from the encoding of said information symbols.

Secondly, the invention concerns an apparatus for processing data comprising a source of information symbols, said apparatus being remarkable in that it further comprises:
- a storage unit adapted to accumulate said symbols so as to form codewords a each containing a predetermined number k of symbols,
- an encoding device as described succinctly above,
- a shortening unit adapted to delete said components of predetermined value from v', so as to form a word v of length n, and
- a transmitter adapted to transmit the words v resulting from the encoding of said information symbols.

The invention also relates to:
- a non-removable data storage means comprising computer program code instructions for the execution of the steps of any one of the encoding methods succinctly described above,
- a partially or wholly removable data storage means comprising computer program code instructions for the execution of the steps of any one of the encoding methods succinctly described above, and
- a computer program containing instructions such that, when said program controls a programmable data processing device, said instructions lead to said data processing device implementing one of the encoding methods succinctly described above.

The advantages of that encoding device, those data processing apparatuses, those data storage means and that computer program are essentially the same as those of the corresponding encoding methods succinctly described above.

Figure 1:
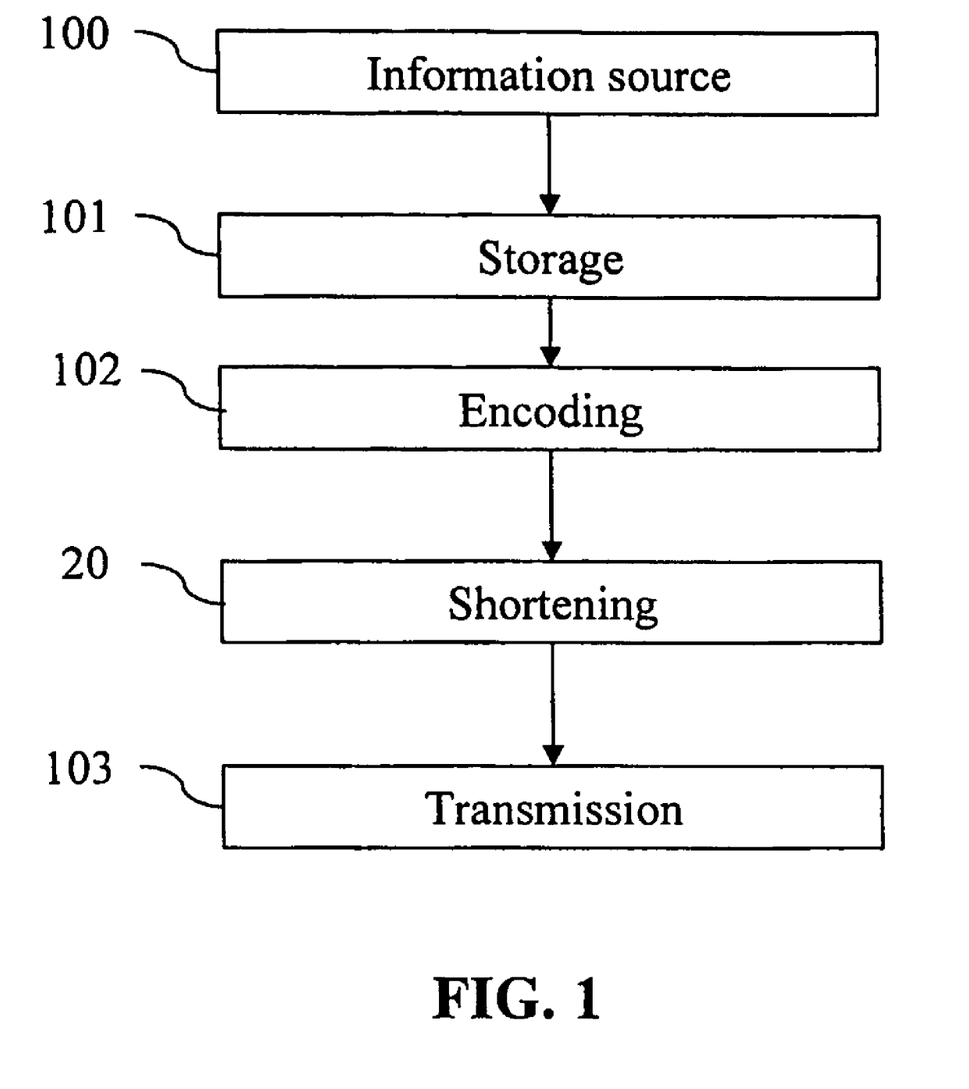
FIG. 1 is a block diagram of a system for encoding information symbols according to an embodiment of the invention.

Other aspects and advantages of the invention will emerge from a reading of the following detailed description of particular embodiments, given by way of non-limiting example. The description refers to the accompanying drawings, in which:

FIG. 1 is a block diagram of an encoding system according to an embodiment of the invention.

The function of this system is to encode information of any nature from a source 100. First of all, the source 100 puts this information into the form of symbols belonging to a certain alphabet (for example bytes of bits in the case in which the size q of the alphabet is 256), and transmits these symbols to a storage unit 101, which accumulates the symbols so as to form sets each containing k symbols. Next, each of these sets is transmitted by the storage unit 101 to an encoding unit 102 which constructs a "pre-encoded" word v' belonging to a certain Reed-Solomon code (in the strict sense) C'.

It will now be recalled how the so-called "Euclidean" encoding algorithm operates for a cyclic linear code of length n and polynomial generator g(x), of degree m=n−k.

Firstly, on the basis of the sequence $a=(a_0, a_1, \ldots, a_{k-1})$ of information symbols, there is formed the polynomial $$a(x) \equiv \sum_{i=m}^{n-1} a_{i-m} x^i.$$

Next a(x) is divided by g(x), which is written:

$$a(x) = q(x)g(x) + r(x),$$

where q(x) designates the quotient, and in which the degree of the remainder r(x) is strictly less than m. If we then take $$v(x) \equiv a(x) - r(x),$$

it can be seen that v(x) is a multiple of g(x), and thus truly represents a word v belonging to the code. Explicitly, if we write $$r(x) \equiv \sum_{i=0}^{m-1} r_i x^i.$$

the codeword obtained by this Euclidean algorithm is $$v = (-r_0, \ldots, -r_{m-1}, a_0, a_1, \ldots, a_{k-1}).$$

Among the components of v so obtained, k are respectively equal to components of a: this is thus a case of "systematic" encoding.

For example, take: $q=2^4$, $k=10$, and $n=q-1=15$, i.e. $m=5$. Consider more particularly the Galois field in which a primitive element $\gamma$ satisfies $\gamma^4+\gamma+1=0$. The polynomial generator is $$g(x) = \prod_{i=1}^{5}(x-\gamma^i) = x^5 + \gamma^7 x^4 + \gamma^2 x^3 + \gamma^5 x^2 + \gamma x + 1, \quad (2)$$

Which divides $(x^{15}-1)$.

Let for example $$a=(\gamma^4,0,\gamma^7,1,0,0,0,0,0,0),$$

corresponding to the polynomial $$a(x)=x^8+\gamma^7 x^7+\gamma^4 x^5.$$

be an information sequence to be encoded.

The Euclidean division of a(x) by g(x) then respectively gives a quotient and a remainder equal to $$q(x)=x^3+\gamma^2 x+\gamma^{12}, \; r(x)=\gamma x^4+\gamma^4 x^3+\gamma^6 x^2+\gamma^{14} x+\gamma^{12}.$$

Finally (noting that on $F_{16}$, the signs + and − are equivalent), we obtain $$v(x)=x^8+\gamma^7 x^7+\gamma^4 x^5+\gamma x^4+\gamma^4 x^3+\gamma^6 x^2+\gamma^{14} x+\gamma^{12}, \text{ that is}$$

$$v=(\gamma^{12},\gamma^{14},\gamma^6,\gamma^4,\gamma,\gamma^4,0,\gamma^7,1,0,0,0,0,0,0).$$

If, instead, it had been desired to calculate v by solving $H \cdot v^T = 0$, this would have been performed working with the parity matrix $$H = \begin{bmatrix} 1 & \gamma & \gamma^2 & \gamma^3 & \gamma^4 & \gamma^5 & \gamma^6 & \gamma^7 & \gamma^8 & \gamma^9 & \gamma^{10} & \gamma^{11} & \gamma^{12} & \gamma^{13} & \gamma^{14} \\ 1 & \gamma^2 & \gamma^4 & \gamma^6 & \gamma^8 & \gamma^{10} & \gamma^{12} & \gamma^{14} & \gamma & \gamma^3 & \gamma^5 & \gamma^7 & \gamma^9 & \gamma^{11} & \gamma^{13} \\ 1 & \gamma^3 & \gamma^6 & \gamma^9 & \gamma^{12} & 1 & \gamma^3 & \gamma^6 & \gamma^9 & \gamma^{12} & 1 & \gamma^3 & \gamma^6 & \gamma^9 & \gamma^{12} \\ 1 & \gamma^4 & \gamma^8 & \gamma^{12} & \gamma & \gamma^5 & \gamma^9 & \gamma^{13} & \gamma^2 & \gamma^6 & \gamma^{10} & \gamma^{14} & \gamma^3 & \gamma^7 & \gamma^{11} \\ 1 & \gamma^5 & \gamma^{10} & 1 & \gamma^5 & \gamma^{10} & 1 & \gamma^5 & \gamma^{10} & 1 & \gamma^5 & \gamma^{10} & 1 & \gamma^5 & \gamma^{10} \end{bmatrix},$$

which clearly implies burdensome calculations. Thanks to this example, it can thus be seen that the Euclidean algorithm provides the codeword sought in a much less complex manner than by using the parity matrix of the code.

The present invention makes it possible to take advantage of that simplicity by judiciously adapting the Euclidean algorithm to the case of shortened codes, whatever the positions of the components of the codewords v' (of length n') intended to be conserved in the shortened codewords v (of length n). The set of these positions will be denoted $$s = (s_0, s_1, \ldots, s_{n-1}),$$

in which the integers $s_i$ ($0 \leq i \leq n-1$) are strictly increasing, and naturally $s_0 \geq 0$, $S_{n-1} \leq n'-1$. In the context of the invention, an "MDS" cyclic linear code, as defined above, is designated by C' and the code obtained by shortening the code C' is designated by C.

More particularly, the method according to the invention performs a "systematic" encoding of any information sequence $a = (a_0, a_1, \ldots, a_{k-1})$. It comprises the following main steps.

In a first step, forming the polynomial $$a(x) \equiv \sum_{i=m}^{n-1} a_{i-m} x^{s_i}$$

where $m \equiv n'-k' = n-k$) on the basis of the information sequence a.

In a second step, calculating the remainder r(x) of the Euclidean division of a(x) by g(x), which is the polynomial generator of C'. As g(x) is of degree m, the degree of r(x) is at most equal to (m−1).

In a third step, calculating the polynomial $$v^*(x) = a(x) - r(x) \equiv \sum_{i=0}^{n'-1} v_i^* x^i,$$

corresponding to the word $v^* = (v^*_0, v^*_1, \ldots, v^*_{n'-1})$ belonging to C'. It should be noted that, by construction, the contribution of a(x) to v*(x) only contains powers of x belonging to s (the smallest being greater than or equal to $S_m$).

The two main cases are then to be envisaged for the fourth step of the method according to the invention.

If the m first integers of s comprise all the successive integers from 0 to (m−1), then the contribution of r(x) to v*(x) only contains powers of x belonging to s (the largest being less than or equal to $s_{m-1} = m-1$). In this case, it suffices to take v'=v*.

On the other hand, if there is at least one "hole" in the succession of the m first integers of s (and thus $s_{m-1} > m-1$, $s_m > m$, and so forth), calculation will now be made of a word v' satisfying:

$v'_i = v^*_i$ for $s_m \leq i \leq n'-1$ (contribution of a(x)), and $v'_i = c_i$, in which the $c_i$ are predetermined constants, for all $i < s_m$ not belonging to s, that is to say different from $s_0$, $s_1, \ldots, s_{m-1}$; these values of i are thus $(s_m - m)$ in number.

It will be noted that $v^*_i = 0$ for $m \leq i \leq (s_m - 1)$; but, in the case considered in which $s_{m-1} > m-1$, $v'_i = 0$ will not necessarily be satisfied for those indices, even when $c_i = 0$. This is because, according to the invention, a word v' belonging to C' is obtained by linear combination of v* with e, where $e \equiv s_m - m$, judiciously chosen words $\Gamma^j$ belonging to C':

$$v' = v^* + \sum_{j=0}^{e-1} f_j \Gamma^j, \tag{1}$$

in which the coefficients $f_j$ belong to $F_q$. Explicitly, this means:

for $s_m \leq i \leq n'-1$: $v'_i = v^*_i$, (1a)

• for $m \leq i < s_m$: $v'_i = \sum_{j=0}^{s_m - m - 1} f_j \Gamma_i^j$, and (1b)

• for $0 \leq i < m$: $v'_i = v^*_i + \sum_{j=0}^{s_m - m - 1} f_j \Gamma_i^j$. (1c)

The words $\Gamma^j$ are constructed from the coefficients of $$g(x) \equiv \sum_{p=0}^{m-1} g_p x^p.$$

More particularly, the words $\Gamma^j$ are defined as follows:

for $j \leq i \leq j+m$: $\Gamma^j_i = g_{i-j}$, and (3a)

$-\Gamma^j_i = 0$ otherwise. (3b)

Explicitly:

$\Gamma^0 = (g_0, g_1, \ldots, g_m, 0, \ldots, 0)$ $\Gamma^1 = (0, g_0, g_1, \ldots, g_m, 0, \ldots, 0).$

. . .

$\Gamma^{e-1} = (0, \ldots, 0, g_0, g_1, \ldots, g_m, 0, \ldots, 0)$, in which the index of the last non-zero component is $i = s_m - 1$.

The polynomial corresponding to the word $\Gamma^0$ being identical to g(x), it is of course divisible by g(x), and $\Gamma^0$ thus belongs to C'. The other words $\Gamma^j$ just being circular permutations of $\Gamma^0$, they also belong to C'.

It then only remains to find the e coefficients of $f_j$ which satisfy the system of e equations concerned (in which it is stipulated that $v'_i = c_i$, as mentioned above) among the n' linear equations represented by equation (1). It can be shown that, with the definitions (3a-3b), the determinant of that system is non-zero whatever said equations concerned are; this property is linked to the "MDS" character of the code C'.

The method described above will now be illustrated by means of a numerical example.

Take, for example, for code C', the one which served above by way of example, to illustrate the Euclidean algorithm (q=2$^4$, k'=10, n'=q−1=15, m=5, and g(x) given by equation (2)). It is desired to shorten it to construct a code C of dimension k=5 and length n=10; more specifically, suppose that it is wished to obtain $v'_i = 0$ for i not belonging to $$s = (1,2,4,5,7,8,10,11,13,14).$$

Thus, $s_m = 8$, and e=8−5=3, and the three indices in question (that is to say not belonging to s, and less than $s_m = 8$) are: 0, 3 and 6. This then gives:

$$\Gamma^0 = (1, \gamma, \gamma^5, \gamma^2, \gamma^7, 1, 0, \ldots, 0)$$

$$\Gamma^1 = (0, 1, \gamma, \gamma^5, \gamma^2, \gamma^7, 1, 0, \ldots, 0),$$

$$\Gamma^2 = (0, 0, 1, \gamma, \gamma^5, \gamma^2 \gamma^7, 1, 0, \ldots, 0),$$

and thus, in particular:

$$\Gamma^0_0 = 0, \Gamma^0_3 = \gamma^2, \Gamma^0_6 = 0,$$

$$\Gamma^1_0 = 0, \Gamma^1_3 = \gamma^5, \Gamma^1_6 = 1, \text{ and}$$

$$\Gamma^2_0 = 0, \Gamma^2_3 = \gamma, \Gamma^2_6 = \gamma^7.$$

Let for example the following information sequence be encoded $$a = (\gamma^9, 0, \gamma^{11}, 0, 0)$$

The following polynomial is then made to correspond to it $$a(x) = \gamma^{11} x^{11} + \gamma^9 x^8,$$

and Euclidean division by g(x) gives:

$$q(x) = \gamma^{11} x^6 + \gamma^3 x^5 + \gamma^9 x^4 + \gamma^6 x^3 + \gamma^{14} x^2 + \gamma^{13} x + \gamma^8, \text{ and}$$

$$r(x) = \gamma x^4 + \gamma x^3 + \gamma^{13} x^2 + \gamma^{10} x + \gamma^8.$$

Consequently, $$v^*(x) = \gamma^{11} x^{11} + \gamma^9 x^8 + \gamma x^4 + \gamma x^3 + \gamma^{13} x^2 + \gamma^{10} x + \gamma^8.$$

and thus: $v^*_0 = \gamma^8$, $v^*_3 = \gamma$ (naturally $v^*_6 = 0$).

Solving the 3 equations (1) then gives:

$$f_0 = \gamma^8, f_1 = \gamma^2, f_2 = \gamma^{10}.$$

Finally, the following is obtained:

$$v' = v^* + \gamma^8 \Gamma^0 + \gamma^2 \Gamma^1 + \gamma^{10} \Gamma^2 = (0, \gamma^{14} \gamma^{12} \cdot 0, 1, 0, 0, \gamma^{10}, \gamma^9, 0, 0, \gamma^{11} 0, 0, 0).$$

In this embodiment, once the encoding is terminated, the encoding unit 102 transmits the "pre-encoded" words v' to a shortening unit 20, which deletes the components of v' of which the index does not belong to the set s. Thus the words v belonging to the shortened code C are obtained.

Thus, in the numerical example which has just been considered, the following is obtained:

$$v = (\gamma^{14}, \gamma^{12}, 1, 0, \gamma^{10}, \gamma^9, 0, \gamma^{11}, 0, 0)$$

It is clear, in view of the above account, that the lower the value of e, the lesser will be the calculations implied by the method according to the invention. It will now be shown how it is possible to minimize the value of e according to a refinement to the invention, for given s.

As was shown above, the value of e is linked to the existence of "holes" in a succession of m consecutive elements of s. The refinement in question thus consists of searching in s for the sequence of m consecutive elements having the least "holes", and of bringing that sequence to the beginning of the words of the code C', taking advantage of the cyclic character of that code.

This strategy will be better understood with the aid of a numerical example. Let us resume the example in which the polynomial generator is given by equation (2), but this time a set of predetermined positions will be considered which is given by:

$$s = (1, 4, 6, 7, 8, 9, 11, 12, 13, 14)$$

Here $s_m = s_5 = 9$, and thus the strict application of the method described above leads to forming the following polynomial from an information sequence a of length 5:

$$a(x) = a_0 x^9 + a_1 x^{11} + a_2 x^{12} + a_3 x^{13} + a_4 x^{14}.$$

Euclidean division makes it possible to construct the word $$v^* = (-r_0, -r_1, -r_2, -r_3, -r_4, 0, 0, 0, 0, a_0, a_1, a_2, a_3, a_4).$$

in which it is proposed, for example, to transform the e=4 components $v^*_0, v^*_2, v^*_3,$ and $v^*_5$ into constants which are all zero in the manner taught by the invention.

It will now be shown that there is another manner of performing the calculations, which is appreciably less complex since it leads to a lower value of e, i.e. e*=1.

Indeed, it is noted that, in s, the sequence of 5 consecutive positions 8,9,11,12,13 has only a single "hole", i.e. position No. 10. Thus, if on all the words of code C', a circular permutation of 8 positions to the left is performed, the initial position of that sequence, i.e. position No. 8, is brought to initial position No. 0. Overall, s is thus transformed into $$s^* = (0, 1, 3, 4, 5, 6, 8, 11, 13, 14),$$

recalling that the positions of components are defined modulo n'=15. Thus, in s*, the sole "missing" position below $s^*_m = s^*_5 = 6$ is position No. 2, which corresponds indeed to e*=1.

In polynomial "language", this circular permutation of 8 positions to the left corresponds to a multiplication by $x^{-8}$ modulo $(x^{15} - 1)$. Now make the following polynomial correspond to the information sequence a:

$$a(x) = a_0 x + a_1 x^4 + a_2 x^6 + a_3 x^7 + a_4 x^{14}.$$

and define $$a^*(x) \equiv x^{-8} a(x) = a_4 x^6 + a_0 x^8 + a_1 x^{11} + a_2 x^{13} + a_3 x^{14}.$$

The Euclidean division of a*(x) by g(x) then gives a remainder $$r^*(x) = r^*_4 x^4 + r^*_3 x^3 + r^*_2 x^2 + r^*_1 x + r^*_0.$$

It is thereby deduced that $v^*(x) \equiv a^*(x) - r^*(x)$, hence $$v^* = (-r^*_0, -r^*_1, -r^*_2, -r^*_3, -r^*_4, 0, a_4, 0, a_0, 0, 0, a_1, 0, a_2, a_3).$$

In this word $v^*$, solely the component $v^*_2 = -r^*_2$ is both non-zero (in general) and absent from $s^*$. The technique taught according to the invention is next implemented, now with $e^* = 1$, to deduce from $v^*$ a codeword $v'$ having $v'_2 = 0$.

It remains nevertheless to apply a circular permutation of 8 positions to the components of this word $v'$, this time to the right, to get back to the positions prescribed by s. In this way a word of C' is obtained which is the final result of the encoding according to the invention of the information sequence a.

The words v issuing from the shortening unit 20 are finally transmitted by the transmission unit 103 to a predetermined recipient. This recipient may for example form part of a complex encoding system (for example relying on a multiplicity of shortened Reed-Solomon codes). This recipient may, according to another example, be a transmission chain comprising a modulator, which associates a modulation symbol with each predetermined number of binary symbols (bits), followed by a recorder or else (respectively) by a transmitter inserting the symbols in a transmission channel, that channel for example able to be a storage on a suitable carrier (such as a DVD, or a magnetic or magnetico-optical disc, or else magnetic tape), or (respectively) transmission by wire or wireless transmission (such as a radio link).

Figure 2:
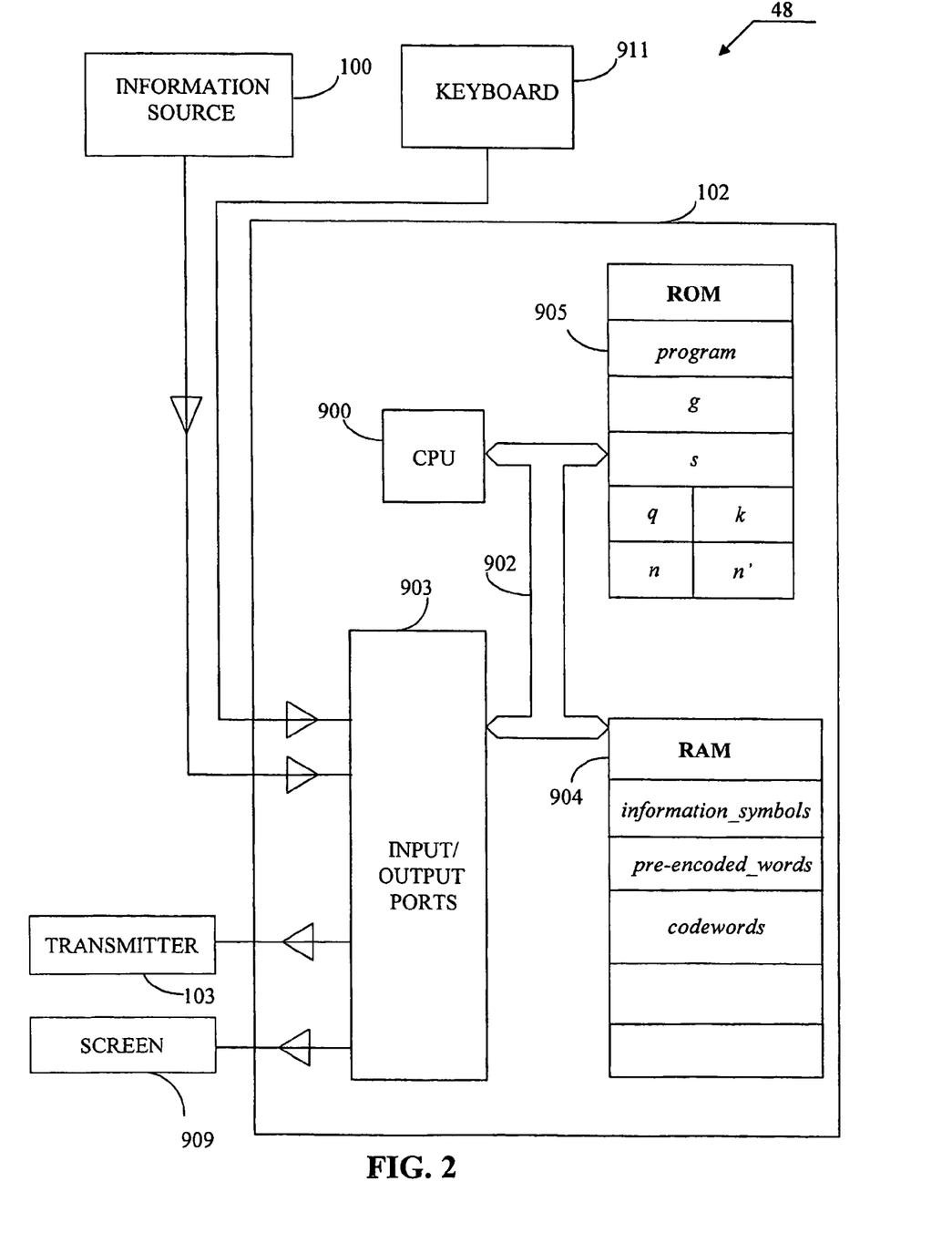
FIG. 2 shows a data processing apparatus comprising an encoder according to the invention.

The block diagram of FIG. 2 represents, very schematically, a data processing apparatus 48 incorporating the encoder 102.

This apparatus 48 comprises a keyboard 911, a screen 909, a source of external information 100, a transmitter 103, conjointly connected to input/output ports 903 of an encoding device 102 which is implemented here in the form of a logic unit.

The encoding device 102 comprises, connected together by an address and data bus 902:

a central processing unit 900,
a random access memory RAM 904,
a read only memory 905, and
said input/output ports 903.

Each of the elements illustrated in FIG. 2 is well known to a person skilled in the art of microcomputers and transmission systems and, more generally, of information processing systems. These known elements are therefore not described here. It should be noted, however, that:

the information source 100 could, for example, be an interface peripheral, a sensor, a demodulator, an external memory or other information processing system (not shown), and could for example supply sequences of signals representing speech, service messages or multimedia data in particular of IP or ATM type, in the form of sequences of binary data, and the transmitter 103 is adapted to transmit the words belonging to code C, for example to a unit belonging to a complex encoding system, or to a device for sending on a radio channel or for recording on a carrier for mass storage.

The random access memory 904 stores data, variables and intermediate processing results, in memory registers bearing, in the description, the same names as the data whose values they store. It should be noted, in passing, that the word "register" designates, throughout the present description, a memory area of low capacity (a few items of binary data) and equally well a memory area of high capacity (for storing a complete program) within a random access memory or read only memory.

The random access memory 904 contains in particular the following registers:

a register "information_symbols" in which the information symbols belonging to $F_q$ are stored, a register "pre_encoded_words", in which the words $v'$ belonging to the non-shortened code are stored, and a register "code_words", in which the words v belonging to the shortened code are stored, before being submitted to the transmitter 103.

The read only memory 905 is adapted to store, in registers which, for convenience, have the same names as the data which they store:

the operating program of the central processing unit 900, in a register "program", the length n' of the words belonging to the non-shortened code, in a register "n'", the length n of the words belonging to the shortened code, in a register "n", the set s of the positions of the components to keep after shortening, in a register "s", the cardinal of the Galois field $F_q$ serving as alphabet for the code used, in a register "q", the number $k = n - m$ of information symbols serving to construct a codeword, in a register "k", and the coefficients of the polynomial generator g(x) of the non-shortened code, in a register "g".

The invention claimed is:

1. A method of encoding over a Galois field $F_q$, where q is an integer greater than 2 and equal to a power of a prime number, in which a word $v' = (v'_0, v'_1, \ldots, v'_{n'-1})$ is calculated, where $n' \geq 3$, belonging to an MDS linear cyclic code C' of dimension (n'-m), where $1 \leq m \leq n'-2$, on the basis of a word $a = (a_0, a_1, \ldots, a_{n-m-1})$ of information symbols, where $m < n < n'$, in which a set $s = (s_0, s_1, \ldots, s_{n-1})$ of strictly increasing integers, with $s_0 \geq 0$ and $s_{n-1} \leq n'-1$, having been predetermined, the method comprising the steps of:

a) forming the polynomial $$a(x) \equiv \sum_{i=m}^{n-1} a_{i-m} x^{s_i},$$

b) calculating the remainder r(x) of the Euclidean division of a(x) by the polynomial $$g(x) \equiv \sum_{p=0}^{m} g_p x^p$$

generating said code C', c) calculating the polynomial $$v^*(x) = a(x) - r(x) \equiv \sum_{i=0}^{n'-1} v^*_i x^i,$$

corresponding to the word $v^* = (v^*_0, v^*_1, \ldots, v^*_{n'-1})$, and d) taking $v' = v^*$ if $s_{m-1} = m - 1$; otherwise obtaining said word $v'$ by taking:

$$\underline{v}' = \underline{v}^* + \sum_{j=0}^{s_m-m-1} f_j \Gamma^j \quad (1)$$

in which the words $\Gamma^j$ of length n' are defined by: $\Gamma^j_i = g_{i-j}$ for $j \leq i \leq j+m$, and $\Gamma^j_i = 0$ otherwise, and in which the elements $f_j$ of $F_q$ are calculated by means of the equations (1) in which, for the $(s_m - m)$ values of $i < s_m$ not belonging to the set s, each component $v'_i$ is taken equal to a respective predetermined constant.

2. An encoding method according to claim 1, further comprising the step of deleting said components of predetermined value from v', so as to form a word v of length n.

3. A method of encoding over a Galois field $F_q$, where q is an integer greater than 2 and equal to a power of a prime number, in which a word $v' = (v'_0, v'_1, \ldots, v'_{n'-1})$ is calculated, where $n' \geq 3$, belonging to an MDS linear cyclic code C' of dimension (n'−m), where $1 \leq m \leq n'-2$, on the basis of a word $a = (a_0, a_1, \ldots, a_{n-m-1})$ of information symbols, where m<n<n', in which a set $s = (s_0, s_1, \ldots, s_{n-1})$ of strictly increasing integers, with $s_0 \geq 0$ and $s_{n-1} \leq n'-1$, and a non-singular diagonal matrix B of dimension n having been predetermined, the method comprising the steps of:

constructing, on the basis of the information symbols, the polynomial $$a^B(x) \equiv \sum_{i=m}^{n-1} a_{i-m} \beta_{s_i}^{-1} x^{s_i},$$

where $\beta_i$ is the element of B in position (i, i), implementing steps b), c) and d) of the method according to claim 1, by replacing a(x) with $a^B(x)$, which gives a word $v'^B$, deleting the components of predetermined value from $v'^B$, which gives a word $v^B = (v^B_0, v^B_1, \ldots, v^B_{n-1})$, and calculating the word $v = (v_0, v_1, \ldots, v_{n-1})$ defined by: $v_i = v^B_i \beta_i$ for all i from 0 to (n−1).

4. An encoding method according to any one of the preceding claims, in which n' is equal to (q−1) or is a divisor of (q−1), and $$g(x) = \prod_{i=1}^{m} (x - \alpha^i),$$

where α is an element of $F_q$ satisfying $\alpha^{n'} = 1$.

5. A method of encoding for algebraic geometric codes, comprising at least one step in which codewords belonging to a shortened MDS linear cyclic code are calculated, in which the calculation is performed by means of an encoding method according to any one of claims 1 to 3.

6. A device (102) for encoding over a Galois field $F_q$, where q is an integer greater than 2 and equal to a power of a prime number, in which a word $v' = (v'_0, v'_1, \ldots, v_{n'-1})$ is calculated, where $n' \geq 3$, belonging to an "MDS" linear cyclic code C' of dimension (n'−m), where $1 \leq m \leq n'-2$, on the basis of a word $a = (a_0, a_1, \ldots, a_{n-m-1})$ of information symbols, where m<n<n', characterized in that, a set $s = (s_0, s_1, \ldots, s_{n-1})$ of strictly increasing integers, with $s_0 \geq 0$ and $s_{n-1} \leq n'-1$, having been predetermined, it is adapted to:

a) form the polynomial $$a(x) \equiv \sum_{i=m}^{n-1} a_{i-m} x^{s_i},$$

b) calculate the remainder r(x) of the Euclidean division of a(x) by the polynomial $$g(x) \equiv \sum_{p=0}^{m} g_p x^p$$

generating said code C', c) calculate the polynomial $$v^*(x) = a(x) - r(x) \equiv \sum_{i=0}^{n'-1} v_i^* x^i,$$

corresponding to the word $v^* = (v^*_0, v^*_1, \ldots, v^*_{n'-1})$, and d) take $v' = v^*$ if $s_{m-i} = m-1$; otherwise to obtain said word v' by taking:

$$\underline{v}' = \underline{v}^* + \sum_{j=0}^{s_m-m-1} f_j \Gamma^j, \quad (1)$$

in which the words $\Gamma^j$ of length n' are defined by: $\Gamma^j_i = g_{i-j}$ for $j \leq i \leq j+m$, and $\Gamma^j_i = 0$ otherwise, and in which the elements $f_j$ of $F_q$ are calculated by means of the equations (1) in which, for the $(s_m - m)$ values of $i < s_m$ not belonging to the set s, each component $v'_i$ is taken equal to a respective predetermined constant.

7. An encoding method according to claim 6, characterized in that n' is equal to (q−1) or is a divisor of (q−1), and in that $$g(x) = \prod_{i=1}^{m} (x - \alpha^i),$$

where α is an element of $F_q$ satisfying $\alpha^{n'} = 1$.

8. An apparatus for processing data comprising a source of information symbols, comprising:

a storage unit adapted to accumulate the symbols so as to form codewords a each containing a predetermined number k of symbols, an encoding device according to claim 6 or claim 7, and a transmitter adapted to transmit the words v' resulting from the encoding of the information symbols.

9. An apparatus for processing data comprising a source of information symbols, comprising:

a storage unit adapted to accumulate the symbols so as to form codewords a each containing a predetermined number k of symbols, an encoding device according to claim 6 or claim 7, a shortening unit adapted to delete said components of predetermined value from v', so as to form a word v of length n, and a transmitter adapted to transmit the words v resulting from the encoding of the information symbols.

10. A non-removable data storage means, comprising computer program code instructions for the execution of the steps of an encoding method according to any one of claims 1 to 3.

11. A partially or wholly removable data storage means, comprising computer program code instructions for the execution of the steps of an encoding method according to any one of claims 1 to 3.

12. A computer program, containing instructions such that, when said program controls a programmable data processing device, said instructions lead to said data processing device implementing an encoding method according to any one of claims 1 to 3.

13. A method of encoding information by means of a given code shortened in at least one predetermined position, comprising the steps of:
   dividing a first polynomial representing information symbols by a generator polynomial so as to obtain a remainder polynomial;
   calculating a second polynomial by subtracting the remainder polynomial from the first polynomial;
   generating a pre-encoded word belonging to the given code from a sequence of coefficients of the second polynomial, so that the component of the pre-encoded word in the at least one predetermined position has a respective predetermined value; and
   generating an encoded word by removing from the pre-encoded word the component in the at least one predetermined position.

14. A method of encoding for algebraic geometric codes, comprising at least one step in which codewords belonging to a shortened code are calculated, in which the calculation of the codewords belonging to the shortened code is performed by using an encoding method according to claim 13.

15. A device for encoding information by means of a given code shortened in at least one predetermined position, comprising:
   means for dividing a first polynomial representing information symbols by a generator polynomial so as to obtain a remainder polynomial;
   means for calculating a second polynomial by subtracting the remainder polynomial from the first polynomial;
   means for generating a pre-encoded word belonging to the given code from a sequence of coefficients of the second polynomial, so that the component of the pre-encoded word in the at least one predetermined position has a respective predetermined value; and
   means for generating an encoded word by removing from the pre-encoded word the component in the at least one predetermined position.

16. Information storage medium which can be read by a computer or a microprocessor storing instructions of a computer program for implementing a coding method according to any one of claims 13 and 14.

17. Information storage medium according to claim 16, in which said storage medium is partially or totally removable.

18. Computer program product comprising sequences of instructions for implementing a coding method according to any of claims 13 and 14.

* * * * *